United States Patent [19]

Salmon

[11] 4,363,026
[45] Dec. 7, 1982

[54] POSITION ENCODER UPDATE MECHANISM AND METHOD

[75] Inventor: John K. Salmon, South Windsor, Conn.

[73] Assignee: Otis Elevator Company, Farmington, Conn.

[21] Appl. No.: 256,768

[22] Filed: Apr. 24, 1981

[51] Int. Cl.³ .............................................. G08C 9/00
[52] U.S. Cl. ............................ 340/347 P; 250/231 SE
[58] Field of Search ...................... 340/870.29, 870.28, 340/347 P; 250/231 SE

[56] References Cited

U.S. PATENT DOCUMENTS 4,041,483 8/1977 Groff .............................. 340/347 P Primary Examiner—C. D. Miller
Attorney, Agent, or Firm—Robert E. Greenstien

[57] ABSTRACT

A position encoder for providing signals that reflect the position of an object is contained in a housing which can be rotated back and forth to update the encoder. The encoder comprises a sun gear and a planet gear, and these gears are connected to an object. From the rotation of these gears, those signals that reflect the position of the object are generated. Rotating the case causes the gears to rotate relative to each other and to sensors which produce the signals. By rotating the case back and forth between reference and update positions, those signals are generated and the encoder is thereby updated without moving the object.

4 Claims, 3 Drawing Figures

POSITION ENCODER UPDATE MECHANISM AND METHOD

TECHNICAL FIELD

This invention relates to position encoders.

BACKGROUND ART

Position encoders are well known, and, in general, there are three types, absolute, incremental, and quasi-absolute. All of these provide a signal of some form which reflects the position of an object to which they are connected. The principal differences between them is that with quasi-absolute and incremental encoders the object must be moved in order to generate the position signal and the signal must be stored, but with an absolute encoder no motion and signal storage is required, because the signal may be repeatedly generated.

One type of quasi-absolute position encoder is explained in U.S. Pat. No. 4,041,483 to Groff titled ABSOLUTE INCREMENTAL HYBRID SHAFT POSITION ENCODER. Another encoder of this general variety is explained in copending U.S. Patent Application Ser. No. 927,242 to Marvin Masel, et al., titled HIGH RESOLUTION AND WIDE RANGE SHAFT POSITION TRANSDUCER SYSTEMS, which is assigned to the same assignee as this application. Both encoders use first and second gears to rotate associated coded discs. One gear is coupled to a shaft which is connected to the object, and the shaft rotates as the object moves. The other gear is driven by the first gear. As the object moves, the first gear and its disc rotate and the second gear and its disc also rotate. Sensors read the disc codes as the discs rotate, and the sensors produce signals which reflect the angular position of each disc. The number of teeth on the first and second gears are different. Thus, the discs rotate at different rates and the relationship between the angular position of each disc identifies a particular location of the object. By comparing the signals produced during one revolution of each of the discs the location is determined and stored. If power is lost, however, that stored location may be lost. Then, the object must be moved to rotate both discs at least one revolution to update the encoder, to determine the location.

One application for these encoders is in elevator systems to provide signals that reflect elevator car location at the building and that are stored in and used by the system controller. But, with these encoders the location of the car would be unknown following a power failure or a disruption which causes the stored location to be lost, and then, when the system is blind, the car would have to be moved some distance up or down to update the encoder, in order to determine the location of the car. Although this typically does not require much car movement, moving the car when its location is not precisely known is awkward and should be avoided, if at all possible.

DISCLOSURE OF INVENTION

An object of the present invention is to provide for updating those position encoders of the type previously described which use at least two gears, but without having to move the object.

According to the present invention, the encoder is housed in a case that can be rotated around the axis of the one gear, and the other gear is attached to the case, displaced radially from that axis of rotation. The disc code reading sensors are attached to the case, and the sensor for the first gear is radially displaced from that axis also. By rotating the case, the second gear rotates around the first gear and relative to its sensor and thus position signals are produced, and the first disc sensor rotates around the first gear disc and thus its position signals are produced. In effect, the first gear becomes a "sun gear" and the second gear becomes a "planet gear" which rotates around the sun gear when the case is rotated. This case is rotated one revolution, and following this full rotation, the case is returned to a normal reference position, where it is locked in place. This return sequence produces the same signals that are produced if the object is moved so as to cause the discs to rotate one revolution. The invention consequently provides an encoder which may be updated, but without moving the object at all.

A feature of the invention is that this update arrangement can be done manually by a service technician. For instance, in an elevator system a technician could enter the machine room, unlock the case and rotate it so as to provide the update information for the controller. Alternatively, the case could be mechanically rotated by remote control, for example, under controller instruction following a power disruption.

Other objects and features of the present invention will be readily apparent from the following description and claims.

BEST MODE FOR CARRYING OUT THE INVENTION

Figure 1:
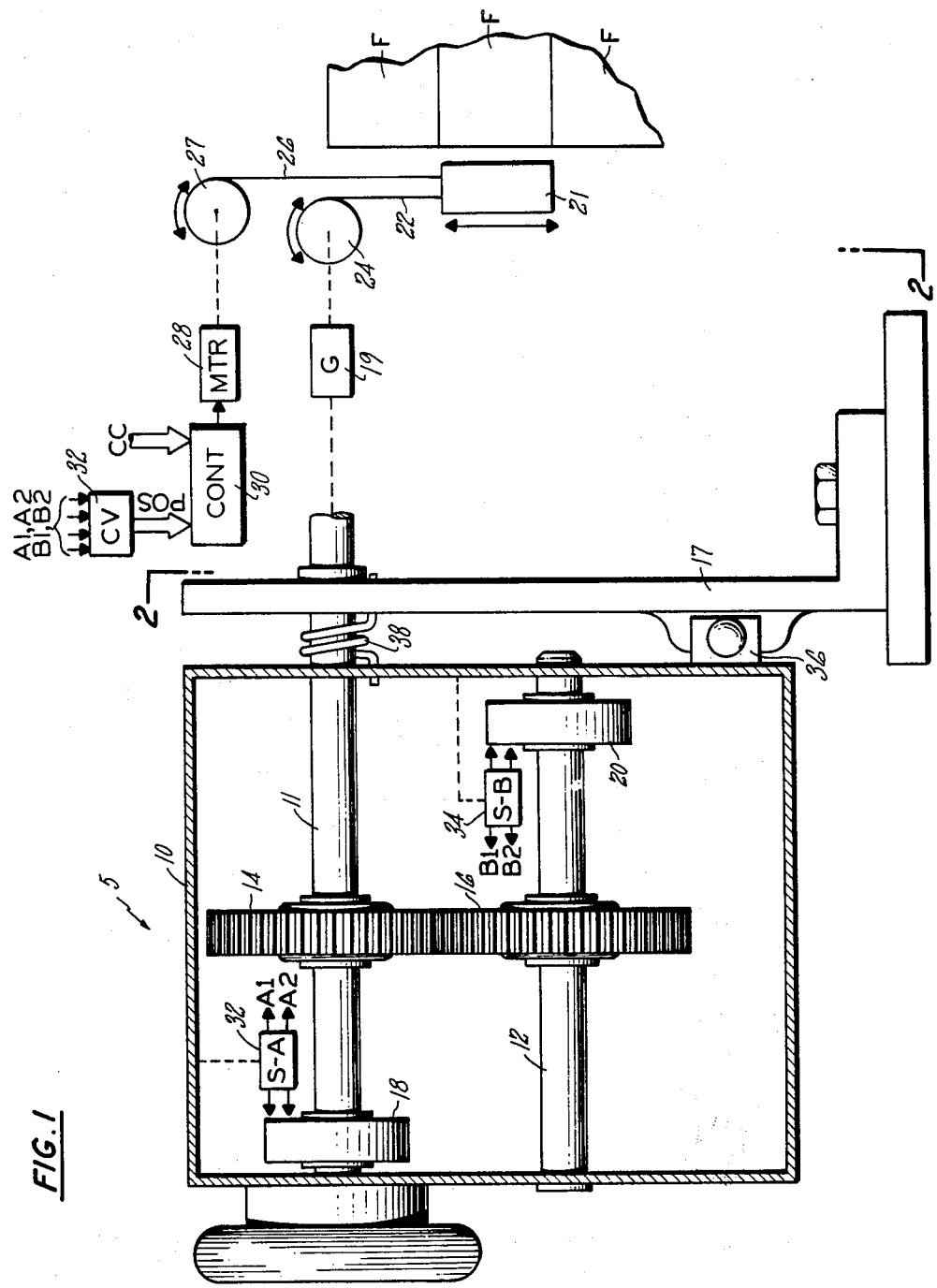
FIG. 1 is a combination of a cutaway view of the case of a quasi-absolute position encoder according to the present invention, exposing the encoder apparatus within the case, and a block diagram of a simple elevator system to which the encoder is connected for encoding elevator car position.

Referring to FIG. 1, a quasi-absolute position encoder 5 according to the present invention comprises a case 10 containing a shaft 11 and a shaft 12 which are coupled together by gears 14 and 16. The case is mounted on a stand or bracket 17. The encoder is used to monitor the rotation of the shaft 11 and is mechanically connected by a gear 19 to an elevator car 21 which is part of an elevator system in a building having a plurality of floors F, of which three are shown. Elevator systems in which this encoder may be used are well known. Thus, this system, which is included to show one possible application for the invention, is greatly simplified. The car is linked to the shaft by a flexible selector tape 22 which rides on a sprocket 24 which is connected to the shaft 11 through the gear, so that as the elevator car moves, the sprocket is rotated, causing the shaft 11 to rotate. The car is supported on a rope 26 which rides on a sheave 27. The sheave is rotated by a motor 28 to raise and lower the car. The motor is controlled by a system controller 30. The system controller receives car control signals CC over a number of input lines. A position signal POS, which reflects the car's location, is furnished by a converter 32 in response to encoder signals A1,A2,B1,B2. These are generated as the car moves.

As the shaft 11 rotates, the gear 14 causes the gear 16 to rotate, and this causes the shaft 12 to rotate. A coded disc 18 is attached to the shaft 11 and a coded disc 20 is attached to the shaft 16. As the shaft 11 rotates, both discs rotate, and the disc codes are read by optical sensors (S-A,S-B). The sensors are attached to the case 30, sensor S-A produces signals A1,A2 and sensor S-B produces signals B1,B2 in response to the rotation of the disc they read. The signals A1,A2 and B1,B2 reflect the angular position of their corresponding disc, and the conversion circuit is programmably responsive to the signals A1,A2 and B1,B2 and produces, as they are generated, the POS signal, based on their relative characteristics. Those charateristics reflect the number of rotations made by the shaft 11, and, thus, the POS signal at any time reflects the position of the car, since each position corresponds to a certain number of turns of the shaft 11 from the ground level. (For more detail on the coding and decoding, see U.S. Pat. No. 4,041,483 to Groff, supra.) The POS word is stored instantaneously in the controller and updated programmably as the car moves. From this, it can be appreciated that in the event there is a power failure the POS stored signal is lost. Then, the gear 16, the sun gear, must be rotated along with the gear 14, the planet gear, to produce signals to update the encoder.

Referring to both FIGS. 1 and 2, now, the updating technique of the invention will be explained. The case 10 is mounted so that it can rotate around the axis of the shaft 11. As this rotation occurs in the CW direction (arrow A), it causes the planet gear 16 and the disc 20 to rotate relative to sensor 34 in direction D1 (see FIG. 2) and signals B1 and B2 are produced, in response. As the case is rotated, the sensor 32 is also rotated relative to disc 18 and signals A1,A2 are produced, in response. (For each rotation of the shaft 11, there is a unique relationship between the signals A1,A2 and B1,B2. See Groff, supra. The case 30 is rotated one full revolution from the reference position (shown in FIG. 2), and a locking stop 36, which normally rests against the stand 17 (shown in FIG. 2), moves to the "update" position shown in FIG. 3. A spring 38 is attached to the case to bias the case to return to the "reference" position from the update position. When the case rotates back to the reference position, the signals A1,A2,B1,B2 from the sensors 22 and 24 are in all respects the same as they would be if the shaft 11 was rotated in the opposite direction; that is, the same as if the car is raised, then lowered, for example. Thus, by rotating the case 30 from the update to reference position, there is no need to move the car connected to the shaft at all (normally it is up or down to cause the discs to rotate once) in order to locate its position following a power failure that causes loss of the POS signal stored in the controller.

Figure 2:
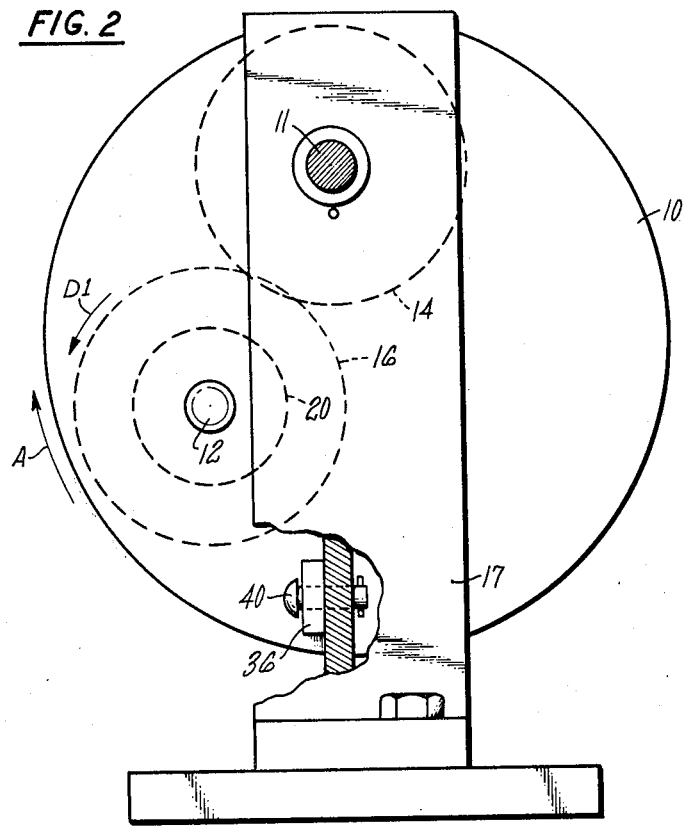
FIG. 2 is an elevated view of the quasi-absolute position encoder shown in FIG. 1 as seen in the direction 2—2, but partially cut away to expose a locking arrangement used for holding the encoder in a nonupdate or reference position.
Figure 3:
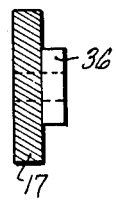
FIG. 3 is an elevation view of that locking arrangement, but showing its configuration when the case is rotated to update the encoder.

As FIG. 2 shows, it is preferable to use an inserted clevis pin 40 (or a lock) to lock the case 10 to the stand 17 in the reference position. Further, one way to rotate the case is manually, with a handle or knob, such as the knob 32 that is attached to the outside of the case and coaxial with shaft 11. To update the system a service technician thus simply removes the pin, rotates the knob to move the case to the update position, and then releases the knob. The case springs back automatically under the force of the spring 36 to the reference position. The technician then inserts the locking pin 40. In lieu of this manual arrangement, a possible variation of the embodiment of the invention shown in the drawings may be an automatic apparatus for rotating the case 30. This apparatus may include a simple motor connected to the case, so as to rotate it to the update position and back to the reference position on command from the controller following a power failure, or allow a spring to do so. Motor arrangements that are suitable for this purpose are well known in the art.

Another variation may be in the updating sequence. Obviously, the location may be determined from the signals A1,A2,B1,B2 produced when the case is rotated to the update position. But then the signals would not reflect the present position of the car, but rather some increment higher or lower. Because each shaft rotation reflects a known distance, that increment is predictable. The discrepancy, therefore, may be resolved simply through programming the converter or the controller to increment the stored position that increment higher or lower than the position that the signals reflect.

From the foregoing description and explanation of the invention and various embodiments of it, one skilled in the art may be able to make various changes, modifications and alterations in and to those embodiments, but without departing from the true scope and spirit of the invention.

I claim:

1. A position encoder comprising a housing on a bracket and within the housing, coupled first and second gears and corresponding coded discs, and sensors for reading the code on each disc as it is rotated and providing signals which reflect the location of an object coupled to the encoder to rotate the gears, characterized in that:
    the case is rotatably attached to the bracket about the axis of one of the gears and can be rotated at least one revolution on that axis from a reference to an update position and returned to the reference position;
    the second gear is positioned on the case radially from the axis of rotation;
    the sensors are attached to the housing;
    the sensor for each disc is attached to and movable with the case, the sensor for the disc associated with the one gear is also attached to the case radially from that axis of rotation and the sensor for the second gear is attached to the case.

2. The apparatus described in claim 1, characterized in that:
    the case includes a member which registers with the bracket when the case is rotated one full revolution and when the case is rotated substantially one revolution in the opposite direction.

3. The apparatus described in claim 1, characterized in that it includes:
    a spring positioned for returning the case to the other of one of the two positions to which it may be rotated.

4. A method for updating a position encoder which comprises, in a housing, a sun gear, a planet gear, encoded discs rotated by each of the gears, sensors for reading the code on each disc for providing a signal which reflects the location of an object coupled to either one of the gears, characterized by the steps:
    rotating the case at least one turn in one direction for generating the position signals, and
    rotating the case in the opposite direction at least one turn for generating the position signals.

* * * * *